US006991739B2

(12) United States Patent
Kawaguchi et al.

(10) Patent No.: US 6,991,739 B2
(45) Date of Patent: Jan. 31, 2006

(54) METHOD OF PHOTORESIST REMOVAL IN THE PRESENCE OF A DIELECTRIC LAYER HAVING A LOW K-VALUE

(75) Inventors: Mark N. Kawaguchi, Palo Alto, CA (US); Huong T. Nguyen, San Ramon, CA (US); Nikolaos Bekiaris, San Jose, CA (US); James S. Papanu, San Rafael, CA (US)

(73) Assignee: Applied Materials, Inc., Santa Clara, CA (US)

( * ) Notice: Subject to any disclaimer, the term of this patent is extended or adjusted under 35 U.S.C. 154(b) by 120 days.

(21) Appl. No.: 09/978,121

(22) Filed: Oct. 15, 2001

(65) Prior Publication Data

US 2003/0075524 A1    Apr. 24, 2003

(51) Int. Cl.
*H01L 21/00* (2006.01)
(52) U.S. Cl. ..................... 216/67; 216/69; 438/725; 438/727; 438/731
(58) Field of Classification Search ........... 156/345.33, 156/345.34; 216/67, 69; 438/725, 727, 438/731
See application file for complete search history.

(56) References Cited

U.S. PATENT DOCUMENTS

| 4,431,898 | A |   | 2/1984  | Reinberg et al. ...... 219/121 PG |
|-----------|---|---|---------|------------------------------------|
| 5,174,856 | A |   | 12/1992 | Hwang et al. ............... 156/643 |
| 5,200,031 | A |   | 4/1993  | Latchford et al. ........ 156/659.1 |
| 5,221,424 | A |   | 6/1993  | Rhoades ...................... 156/643 |
| 5,385,624 | A | * | 1/1995  | Amemiya et al. ...... 156/345.24 |
| 5,403,436 | A |   | 4/1995  | Fujimura et al. ............ 156/643 |
| 5,545,289 | A |   | 8/1996  | Chen et al. ................ 156/643.1 |
| 5,773,201 | A |   | 6/1998  | Fujimura et al. ............ 430/329 |
| 5,968,275 | A | * | 10/1999 | Lee et al. ................. 118/723 R |
| 6,007,671 | A |   | 12/1999 | Fujimura et al. ............ 156/345 |
| 6,024,045 | A |   | 2/2000  | Kikuchi et al. ....... 118/723 ME |
| 6,150,628 | A |   | 11/2000 | Smith et al. ............ 219/121.54 |
| 6,203,657 | B1| * | 3/2001  | Collison et al. ........ 156/345.48 |
| 6,235,453 | B1|   | 5/2001  | You et al. |
| 2001/0024769 | A1 |   | 9/2001 | Donoghue et al. |
| 2002/0185151 | A1 | * | 12/2002 | Qingyuan et al. ............ 134/1.2 |

FOREIGN PATENT DOCUMENTS

| EP | 0 463 870 A1 | 1/1992 |
| WO | WO 01/11650 A1 | 2/2001 |

OTHER PUBLICATIONS

Kikuchi, et al., "*Effects of $H_2O$ on Atomic Hydrogen Generation in Hydrogen Plasma,*" Jun. 1993, *Jpn. J. Appl Phys.* vol. 32 (1993) Part 1, No. 6B, pp. 3120-3124.

Chang, et al., "*Suppression of Copper Diffusion Through Barrier Metal-Free Hydrogen Silsesquioxane Dielectrics by $NH_3$ Plasma Treatment,*" Jun. 2, 1999, *Electrochemical and Solid State Letters*, pp 634-636.

(Continued)

*Primary Examiner*—Allan Olsen
(74) *Attorney, Agent, or Firm*—Blakely Sokoloff Taylor & Zafman (57) ABSTRACT

A method of photoresist removal is described. A substrate is located in a processing chamber. A mixture of gases is excited, the mixture comprising a majority component of a reducing process gas and a minority component of between 0.1% and 10% by volume of an oxidizing process gas. Reactive gas species are thereby generated. A photoresist layer with an exposed dielectric layer on the substrate in the chamber is then exposed to the reactive gas mixture to selectively remove the photoresist layer from the dielectric layer.

26 Claims, 6 Drawing Sheets

OTHER PUBLICATIONS

Nakagawa, et al., "*RIE-Lag-Less Etching by $CH_4/N_2$ Plasma for Organic Low-k Dielectric,*" 2000, *2000 Dry Process Symposium, ULSI Process Technology Development Center, Semiconductor Company, Matsushita Electronics Corp., *Institute for Semiconductor Technologies, ULVAC Japan Ltd.*, pp. 257-262.

Morikawa, et al., "*Organic Low-k Etching Process in Low Pressure and High Density NLD Plasma*", 2000, *2000 Dry Process Symposium*, pp. 263-268.

Janowiak, et al., "*Etching of organic low dielectric constant material SiLK™ on the Lam Research Corporation 4520XLE™,*" *J. Vac. Sci. Technol.*, Jul./Aug. 2000, *2000 American Vacuum Society*, pp. 1859-1863.

Chang, et al., "*The Novel Improvement of Low Dielectric Constant Methylsilsesquioxane by $N_2O$ Plasma Treatment,*" *Journal of The Electrochemical Society*, Oct. 20, 1998, pp. 3802-3806.

Louis, et al., "*Improved Post Etch Cleaning for low-k and copper integration for 0.18 µm Technology,*" *Microelectronic Engineering 46* (1999), pp. 307-310.

Kikuchi, et al., "*Native Oxide Removal on Si Surfaces by $NF_3$-Added Hydrogen and Water Vapor Plasma Downstream Treatment,*" *Jpn. J. Appl. Phys.* vol. 33 (1994), Part 1, No. 4B, Apr. 1994, pp. 2207-2211.

Kikuchi, et al., "*Cleaning of Silicon Surfaces by $NF_3$-Added Hydrogen and Water-Vapor Plasma Downstream Treatment,*" *Jpn J. Appl. Phys.* vol. 35 (1996), Part 1, No. 2B, Feb. 1996, pp. 1022-1026.

* cited by examiner

METHOD OF PHOTORESIST REMOVAL IN THE PRESENCE OF A DIELECTRIC LAYER HAVING A LOW K-VALUE

BACKGROUND OF THE INVENTION

1). Field of the Invention

This invention relates generally to a method of substrate processing, and more specifically to a method of photoresist removal.

2). Discussion of Related Art

Integrated circuits are manufactured on silicon and other semiconductor substrates by forming a multitude of semiconductor devices such as transistors, diodes, capacitors, and other devices on the substrate, and subsequently interconnecting these devices with metal lines and contacts. In conventional aluminum-based metalization techniques, a layer of aluminum is deposited and subsequently patterned to leave aluminum metal components with trenches between them. The trenches are then filled with dielectric material. For emerging copper-based metalization techniques, of which there are a number of variations, a layer of dielectric material is deposited, a pattern is etched into the dielectric, typically vias or trenches, and the metal components, usually copper, are electroplated or deposited.

In contrast to conventional metalization techniques, where silicon dioxide, ($SiO_2$) is the standard dielectric with a nominal k-value of 4, advanced copper-based metalization schemes require low-k dielectric materials to alleviate the increased interconnect capacitance, which occurs when conventional methods are applied to smaller feature sizes. The increased capacitance leads to resistance-capacitance time delays which affect the overall processing speed of the integrated circuit.

In copper-based metalization processes, the dielectric layer is patterned by coating a photoresist layer on the dielectric layer, patterning the photoresist utilizing photolithography, and then using the photoresist layer as a mask to etch the pattern into the dielectric layer. The remaining photoresist and etch residue must then be removed or "stripped" utilizing an additional process. For conventional photoresist removal, an oxygen-based plasma is used. Because the photoresist layer is primarily an organic-based polymer, it oxidizes readily at elevated temperatures when treated with plasma through a mechanism similar to combustion of hydrocarbons in the presence of oxygen.

SUMMARY OF THE INVENTION

The invention provides a method for highly selective photoresist removal. A substrate is transferred to a processing chamber, where it is exposed to an energized gas mixture, the mixture comprising a majority component of a reducing process gas and a minority component of between 0.1% and 10% by volume of an oxygen-containing process gas. A photoresist layer overlaying a dielectric layer on the substrate in the chamber is then exposed to the energized gas mixture to selectively remove the photoresist layer in the presence of an exposed dielectric layer.

The reducing process gas may include at least one of any hydrogen-rich gases such as hydrogen, ammonia, alkanes, alkenes, and so forth.

The mixture may flow through the chamber while the photoresist is removed. The component of the reducing process gas may flow through the chamber at between 1 standard liter per minute and 10 standard liters per minute.

The oxidizing process gas may include at least one of any oxygen-containing gas such as, vaporized water, oxygen, carbon monoxide, carbon dioxide, alcohols, and so forth and preferably includes vaporized water.

The oxidizing process gas may increase the removal rate of the photoresist layer substantially when compared with the reducing process gas alone.

The method may further include the step of heating the substrate prior or during exposure to the reactive gas mixture. The substrate may be at a temperature of between 150° C. and 400° C. while the photoresist layer is exposed to the reactive gas mixture.

In one exemplary embodiment, the energized gas mixture is primarily generated at a location remote from the substrate, the reactive gas mixture flows within containing walls from the location, where they are generated, to the substrate. Surfaces of the containing walls exposed to the reactive radical species may be lined with quartz containing materials. The walls of the chamber may form at least a part of the containing walls. The reactive gas mixture may flow through a plurality of openings in a baffle in the chamber, surfaces of the baffle exposed to the reactive gas mixture being composed of quartz containing materials.

The reactive gas mixture may additionally remove residue remaining from prior etching of the dielectric layer.

The method may further include the step of depositing a metal layer over the dielectric layer. The metal layer may be formed without a wet clean following removal of the photoresist layer.

The gas mixture may be energized by coupling the gas mixture with an electromagnetic field such as an inductive, capacitive, or microwave field. Alternatively, a capacitively coupled electric field may be formed above the substrate to energize the gas above the substrate. The dielectric layer may have a k-value below 3, and may for example be a methyl-doped silicon dioxide.

The mixture may include a minority component of nitrogen gas.

The mixture may include a minority component of a fluorine-containing process gas.

BRIEF DESCRIPTION OF THE DRAWINGS

The invention is further described by way of example with reference to the accompanying drawings wherein.

DETAILED DESCRIPTION OF EXEMPLARY EMBODIMENTS

A method is described for removal of a photoresist layer formed on a dielectric layer having a low k-value without substantial damage to the dielectric layer. A mixture of gases comprising a majority component of a reducing process gas and a minority component of an oxidizing process gas is energized to create reactive species. The photoresist layer is then exposed to the reactive species to remove the photoresist layer from the dielectric layer. The concentration of the oxidizing gas is set sufficiently high to maximize the photoresist removal rate but sufficiently low to avoid damaging the dielectric layer.

Dielectric Patterning

Figure 1:
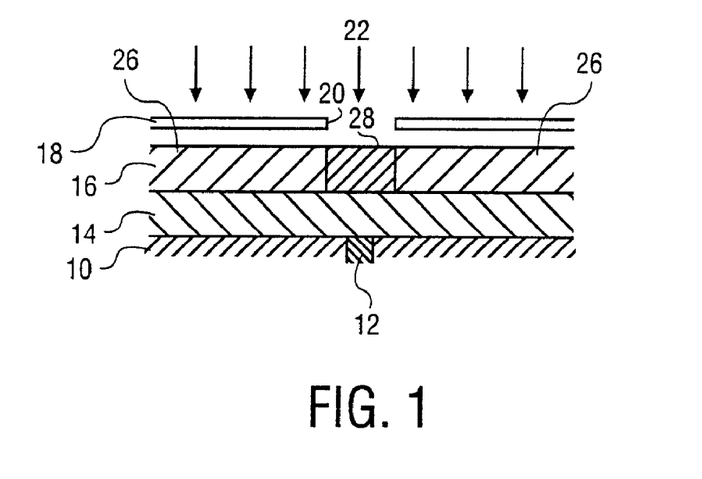
FIG. 1 is a cross-sectional side view of a semiconductor substrate having a dielectric layer and a photoresist layer formed thereon, the photoresist layer being masked.
Figure 2:
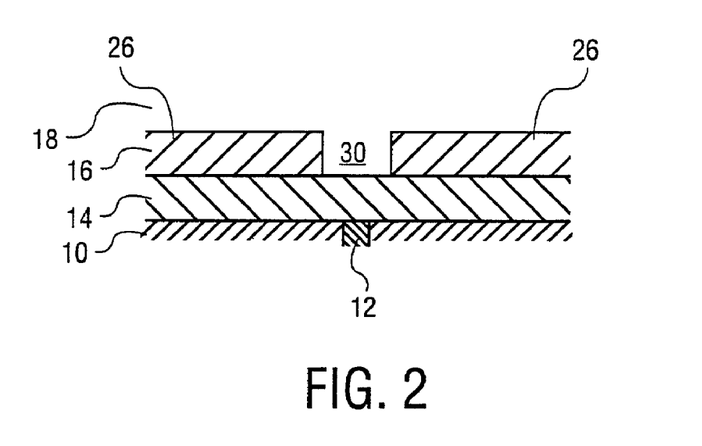
FIG. 2 is a view similar to FIG. 1 after a pattern is transferred to the photoresist layer.
Figure 3:
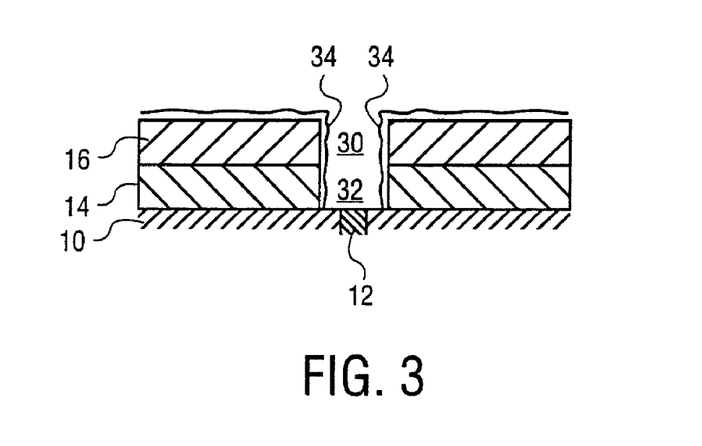
FIG. 3 is a view similar to FIG. 2 after an anisotropic etch step to transfer the photoresist pattern to the dielectric layer.

FIGS. 1 to 3 illustrate dielectric layer patterning utilizing photoresist.

Referring firstly to FIG. 1, a semiconductor substrate 10 is provided having a conductive element 12 formed therein. The conductive element 12 may for example be a conductive gate of a transistor, a metal via, or a metal line. The conductive element 12 has an upper surface in a plane of an upper surface of the semiconductor substrate 10. Electrical contact must be made to the upper surface of the conductive element 12.

A dielectric layer 14 is formed on an upper surface of the semiconductor substrate 10 and the conductive element 12. The dielectric layer 14 has a k-value which is relatively low, typically between 2 and 3. The relatively low k-value of the dielectric layer 14 reduces the capacitance between adjacent metal components formed in the dielectric layer 14. Many types of low-k materials exist. One major class is hydrogen or carbon-doped silicon oxides, such as the Black Diamond film sold by Applied Materials of Santa Clara, Calif. Another major class is primarily organic-based, such as the SiLK film sold by Dow Chemicals of Midland, Mich. A key difficulty for low-k integration is that conventional oxygen-based plasmas damage the dielectric, by increasing its k-value and etching the material itself. In addition, oxygen-based plasmas readily oxidize exposed copper which leads to poor metal contact.

Silicon dioxide ($SiO_2$) has a relatively high k-value of about 3.9. The relatively high k-value of silicon dioxide can be reduced by doping the film with hydrogen or carbon-containing groups, for example methyl ($CH_3$) groups, to lower the k-value down to between 2 and 3. Further reductions in the k-value down to between 1.5–2.5 can be achieved by increasing the porosity of these films. An organic substitute such as a methyl group is highly susceptible to reactive oxygen radicals or ions in a manner not unlike that of photoresist removal. Porous films are even more susceptible because oxygen radicals may penetrate the bulk film and react with the organic substitute. The exposure of the dielectric layer 14 to oxygen radicals or ions is thus perfectly avoided.

A photoresist layer 16 is formed on the dielectric layer 14. The photoresist layer 16 is primarily composed of an organic-based polymer. The photoresist is patterned with standard lithography methods which result in regions where the dielectric layer is exposed for etching and other regions where the photoresist masks the dielectric as shown in FIG. 2. For small features, an anti-reflective coating (ARC) layer such as bottom ARC (BARC) is optionally patterned as well for improved lithography.

An etchant selectively removes the material of the dielectric layer 14 over the material of the photoresist layer 16. A pattern 32 is thereby transferred into the dielectric layer 14. The pattern or opening 32 is located directly below the opening 30 and its width corresponds to a width of the opening 30. An anisotropic etch chemistry is used. An anisotropic etch chemistry ensures directional, vertical etching from the opening 30 to the substrate 10, resulting in a controlled vertical profile.

The etch chemistry also causes the formation of a residue 34. The residue 34 is located on top of the feature and on sidewalls of the openings 30 and 32. The sidewall residue is intentionally formed by using additives to passivate the sidewall which enhance vertical profile control. Both the remaining photoresist 16 and residue 34 must be removed before continuing on to subsequent process steps for example additional etch steps, depositing a metal interconnector via, or additional cleaning steps.

It can thus be seen that a structure is formed in FIG. 3 having a patterned low-k dielectric layer 14 with a remaining photoresist layer 16 and residue. The photoresist layer 16 must be removed without damaging the dielectric layer 14. For the particular illustration in FIG. 3, the dielectric layer can be damaged on the sidewalls and the surface that is exposed when the photoresist is removed. For some integration schemes, the film stack may include additional layers both above and below the dielectric such as a second or dielectric layer. In these schemes, only the sidewalls of the low-k dielectric are exposed directly to the reactive gas mixture. Furthermore, a residue 34 is formed which must be removed before additional processing. For other integration schemes, a hardmask is used rather than a photoresist, but a residue 34 is formed which must be removed before additional processing. For these integration schemes, the metal layer, usually copper, is exposed. It is undesirable to use oxygen chemistry since the copper becomes oxidized, leading to poor electrical contact with the metal.

Photoresist and Residue Removal Apparatus

Figure 4:
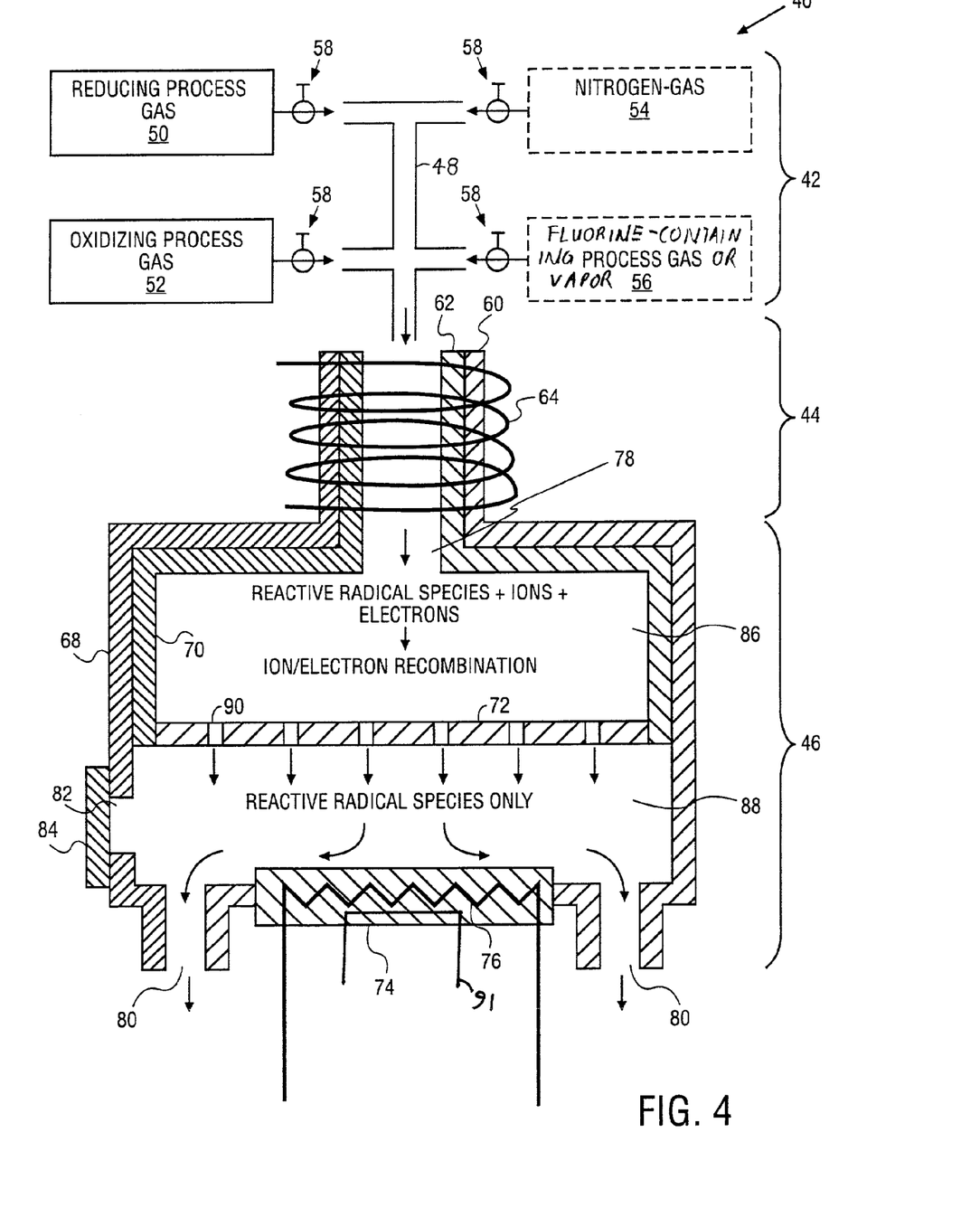
FIG. 4 is a cross-sectional side view illustrating a general embodiment of the stripping apparatus used for carrying out the invention.

FIG. 4 illustrates an exemplary photoresist and residue removal apparatus 40 that may be used for carrying out the method according to the invention. The apparatus 40 includes a gas supply apparatus 42, an apparatus 44 for energizing the gas mixture, and a substrate processing apparatus 46.

The gas supply apparatus 42 includes a supply line 48, a source of a reducing process gas 50, a source of an oxidizing process gas 52, optionally a source of nitrogen gas 54, and optionally a source of a fluorine-containing process gas 56. A respective valve 58 connects a respective source 50, 52, 54, and 56 to the supply line 48.

The apparatus 44 for generating reactive radical species, according to the exemplary embodiment, creates reactive species by coupling the gas mixture with an electromagnetic field that is remote from the substrate. The apparatus generally includes a pass-through pipe 60, a quartz liner 62 on an inner surface of the pipe 60, and a coil 64 that spirals around the pipe 60. The supply line 48 feeds into an upper end of the pipe 60. The center of the coil 64 is located within the pipe 60. The material of the pipe 60 and the quartz of the quartz liner 62 allow for the electromagnetic field to be created within pipe 60 although the coil 64 is located external to the pipe 60. In the exemplary embodiment reactive species are created by energizing a mixture of gases with a radio frequency inductively coupled plasma. A microwave source may alternatively be used creating a microwave-coupled plasma. A capacitive source may also be used by creating a capacitively-coupled plasma. Furthermore, a capacitively-coupled plasma may be generated directly above the substrate by powering the substrate stand 74 and grounding the chamber walls and optionally the baffle 72. The energized gas mixture may be created by the remote source only, capacitively coupling to the substrate stand only, or by simultaneously using the remote source and capacitively-coupling to the substrate stand. It is also possible to utilize a toroidal radio-frequency-based source to create a radio frequency inductively coupled plasma. A toroidal source is described in the specification of PCT/US00/40602 which is incorporated by reference herein. Other apparatuses may exist that can generate reactive radical species out of a mixture as described.

The substrate processing apparatus 46 according to the exemplary embodiment includes a processing chamber 68, a liner 70 (e.g., quartz), a baffle 72, a substrate stand 74, a resistive element 76, and a cooling line 91. For capacitive-coupling to the substrate stand 74, a heat exchanger may replace the cooling line 91. As can be understood, coating of walls 60 and 68 may be used instead of liners 62, 70.

A processing chamber 68 has an inlet opening 78 in an upper wall thereof and outlet openings 80 in a lower wall thereof. The chamber 68 also has a slit 82 in one sidewall thereof. The slit 82 can be opened and closed with a slit valve 84.

The quartz liner 70 is located on the upper walls of the processing chamber 68 and on sidewalls of the processing chamber 68. Optionally, a liner or coating may be added to the lower walls of the chamber 68.

The baffle 72 is located between the upper wall and the lower wall and separates the chamber 68 into a settling cavity 86 and an exposure cavity 88. The baffle 72 is entirely made of quartz and has a plurality of baffle openings 90 formed therein. For generating a capacitively-coupled electric field above the substrate, RF-power is supplied to the substrate stand; the baffle may be embedded with a conductive material or may be replaced entirely with a conductive material such as aluminum which is grounded to the walls off the chamber. Alternatively, the baffle may be RF-powered to generate a softer-bias above the wafer.

A lower end of the pipe 60 feeds into the inlet opening 78 of the processing chamber 68. A gas can flow from the supply line 48 through the pipe 60 into the settling cavity 86 and then through the baffle openings 90 into the exposure cavity 88 of the processing chamber 68. The gas is only exposed to containing walls formed by the quartz liner 62, the quartz liner 70, and the quartz of the baffle 72 from when the gas enters the pipe 60 until when the gas exits through the baffle openings 90 into the exposure cavity 88.

The substrate stand 74 is located within the lower wall of the processing chamber 68 and has an upper horizontal surface located within the exposure cavity 88 of the processing chamber 68. A substrate can be located on the upper horizontal surface of the substrate stand 74. The resistive element 76 is located within the substrate stand 74. A current flowing through the resistive element 76 heats the substrate stand 74 and the upper surface thereof.

Chamber Preheating

Better photoresist removal or stripping results can be obtained when the apparatuses 44 and 46 are conditioned by pre-heating. As will be discussed below, it is believed that the reactivity between the quartz and the energized gas mixture is significantly reduced within the apparatuses 44 and 46. It is also believed that such reactivity is reduced further when the quartz liners 62 and 70 and the quartz of the baffle 72 are preheated. Minimal reactivity from bulk or surface recombination reactions increases the quantity of reactive species available to react with the substrate.

First, substrates are removed from the exposure cavity 88 through the slit 82 and the slit valve 84 is closed. The valves 58 are opened so that at least the gases 50 and 52 flow into the supply line 48 where they mix. The gas mixture then flows through the supply line 48 into the upper end of the pipe 60. The electromagnetic field then energizes the molecules of the gases of the mixture. Molecules are dissociated and ionized to generate a complex mixture of neutral radicals, ions, and electrons. Energy is dissipated from the mixture to the quartz liner 62.

The energized gas mixture then flows through the inlet opening 78 into the settling cavity 86. Additional energy is dissipated from the mixture to the liner 70 and to the baffle 72. The mixture then flows through the baffle openings 90 into the exposure cavity 88, reacts with the substrate, and then flows out of the outlet openings 80.

It can thus be seen that the combination of the gases 50 and 52 together with an electromagnetic field 64 transfers thermal energy to liners 62 and 70 and the baffle 72. These components are preferably heated to a surface temperature of at least 400° C. Alternatively or additionally, heating coils or lamps may be used to heat the walls and liners.

The gas mixture composition is preferably similar or identical to the composition used during photoresist removal. Alternatively the gas mixture may be primarily an oxygen-containing mixture which may optionally include a minority component of nitrogen, a reducing gas, or a fluorine containing gas. This alternative mixture would not only serve the pre-heating requirements, but would also serve as a method for dry chamber cleaning of excess organic and inorganic residue that deposits on the chamber surfaces over many wafers.

Current is also provided through the resistive element 76 so that the resistive element heats the substrate stand 74. A cooling fluid in the cooling line 91 maintains the temperature of the substrate stand 74 at a desired level. In the exemplary embodiment, the substrate stand 74 is heated to a temperature above 120° C. in order to generate the thermal energy required to sustain production-worthy photoresist removal rates. The substrate stand 74 is however not heated to a temperature above 500° C. For alternative embodiments with RF-bias to the substrate, the thermal activation energy requirement is replaced with ion-bombardment, allowing the temperature to be substantially reduced to a minimum temperature of 20° C. For these alternative embodiments a heat exchanger may replace the resistive element and still provide adequate heating.

When the liners 62 and 70 and the baffle 72 reach a surface temperature of 400° C. and the substrate stand 74 reaches a temperature of between 150° C. and 400° C. (for example 250° C.), the valves 58 are closed and current to the coil 64 is switched off. The chamber 68 is then filled with an inert gas, typically the nitrogen gas 54. For purposes of further discussion it should be assumed that these temperatures are maintained throughout further processing.

Photoresist Removal

The slit valve 84 is then moved so that the slit 82 is opened. The substrate 10 of FIG. 3 is then located on a blade and carried on the blade through the slit valve 84 into the exposure cavity 88. The blade positions the substrate 10 on the upper surface of the substrate stand 74. The blade is thereafter removed through the slit valve 84 and the slit 82 is closed by the slit valve 84.

Heat transfers from the resistive element 76 to the substrate stand 74 and from the substrate stand 74 to substrate 10. The heat transfers from the substrate 10 through the dielectric layer 14 to the photoresist layer 16. The photoresist layer 16 is thereby heated to a temperature of between 150° C. and 400° C. (for example 250° C.).

An alternating current is provided through the coil 64. The alternating current in the coil 64 creates a radio frequency field within a core of the pipe 60.

The valves 58 are subsequently opened so that the reducing process gas 50 and the oxidizing process gas 52 flow into and mix in the supply line 8. The mixture of gases then flows from the supply line through the pipe 60 and the chamber 68 out of the outlet openings 80. A pump is connected to the outlet openings 80 which maintains a pressure within the chamber 68 at between 0.2 Torr and 10 Torr.

The reducing process gas 50 comprises a majority component of the mixture and flows at a rate of between 1 standard liter per minute and 10 standard liters per minute (for example 5 standard liters per minute). The reducing process gas 50 may for example be hydrogen, ammonia, an alkane such as methane, ethane, or isobutane, an alkene such as ethylene or propylene, or any combination of these gases.

The oxidizing process gas 52 forms a minority component of between 0.1 and 10% by volume of the mixture. The oxidizing process gas may for example be water vapor, oxygen, carbon monoxide, or an alcohol.

The mixture flows from the supply line 48 into the pipe 60. The electromagnetic field within the core of the pipe 60 energizes the molecules of the gas in a number of ways. First, the molecules are energized so as to cause more collisions between the molecules with a corresponding increase in temperature of the mixture. Second, the internal energy of the molecules is increased so that reactive radical species are created out of the molecules. Third, some electrons are added or subtracted from some of the molecules so that ions are also created from some of the molecules and free electrons also exist within the mixture.

The mixture at its increased temperature and including the reactive radical species, ions, electrons and neutrals then flows through the inlet opening 78 into the settling cavity 86. The ions combine rapidly with the electrons while the muxture is within the settling cavity 86. A result of the ion-electron recombination is that the ion density is substantially reduced.

The density of the radical species is also reduced, although to a much lesser degree than the ions, because of surface and bulk recombination. The rate of recombination is decreased by the quartz of the liners 62 and 70 and the quartz of the baffle 72. As mentioned, the preferred oxidizing process gas 52 is water vapor. It has been found that photoresist removal rates with a reducing gas are substantially increased with only a small component of an oxidizing gas, particularly water vapor. It is believed that an oxidizing component substantially increases the generation and lifetime of the reactive radical species. Furthermore, it is believed that gas capable of hydrogen-bonding, particularly water vapor, can hydrogen bond with the quartz, effectively creating a reducing-rich surface. Reducing radicals that impinge the surface react with the surface and release another radical, thus regenerating the active radical density. It is believed further that high surface temperatures, preferably at least 400° C., reduce the recombination rate even further.

The mixture including the reactive radical species remaining therein then flows through the baffle openings 90 to the exposure cavity 88. Substantially no ions reach the exposure cavity 88.

The reactive radical species then react with the material of the photoresist layer 16. The photoresist layer 16 is primarily an organic polymer. It is believed that the reactive radical species react with the photoresist in a manner similar to high temperature combustion reactions. Organic ARC layers such as BARC are also removed in a similar fashion. Organic residues from the etch process are also removed in a similar fashion. Polymeric molecules are reduced to low molecular weight molecules, primarily carbon dioxide and water. The volatile products are added to the mixture and pumped out of the outlet openings 80.

As mentioned earlier, carbon or hydrogen-containing materials such as methyl groups exist in the dielectric layer 14. However, there is insufficient oxygen in the mixture to substantially react with the organic component of the dielectric. Furthermore, oxidizing gases such as water and alcohols can hydrogen-bond with the inorganic component of the dielectric and effectively protect the dielectric film with a hydrogen-rich passivation film. It can thus be seen that the reactive radical species remove the photoresist layer 16 away but without causing damage to the dielectric layer 14. In addition, a reducing environment avoids oxidation of metals, particularly copper, that may be exposed during the treatment.

Figure 5:
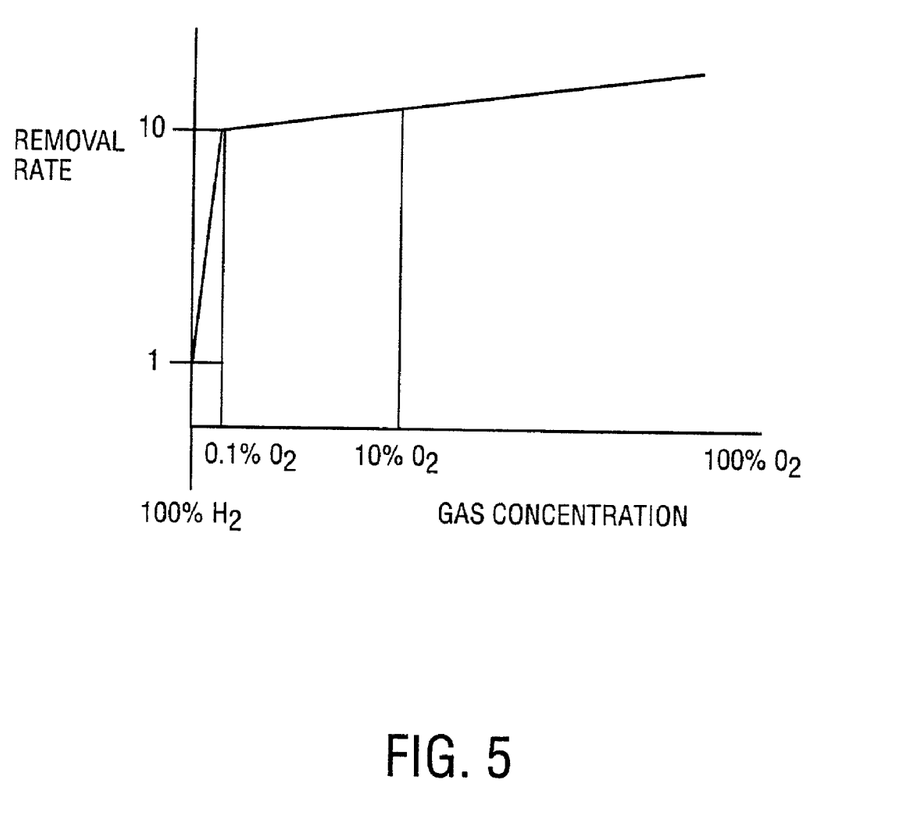
FIG. 5 is a graph illustrating photoresist removal rates against different concentrations of hydrogen gas and oxygen gas.

FIG. 5 illustrates the effect of oxidizing process gas 52 concentration in the reducing process gas 50 on photoresist removal rate. By way of example, the reducing process gas 50 is hydrogen gas and the oxidizing process gas 52 is oxygen gas. Gas concentrations are shown on the abscissa and photoresist removal rates are shown on the ordinate. It can be seen that an inclusion of a small amount of oxygen, on the order of 0.1% by volume, increases the removal rate of the photoresist layer 16 by a factor of approximately 10. Further increases in the oxygen component increase the removal rate further, but not to the same extent as the first 0.1% by volume. The photoresist removal rate can thus be dramatically increased by the inclusion of a small amount of the oxygen gas. Should more than 10% by volume oxidizing gas be included, it has been found that irreparable damage to the dielectric layer 14 may occur. As such, it is preferred that the oxygen containing component be between 0.1% and 10% by volume. Similar results have been found by combining other ones of the oxidizing process gases and other ones of the reducing process gases mentioned.

Referring again to FIG. 4, a minority component of nitrogen gas 54 may also be included. It has been found that nitrogen gas 54 increases photoresist stripping. The nitrogen gas 54 preferably comprises between 0.1% and 10% of the mixture.

A fluorine-containing process gas 56 may also be included in the mixture. The fluorine-containing process gas 56 is preferably a minority component of between 0.1% and 10% of the mixture. The fluorine-containing process gas may for example be $CF_4$, $NF_3$, $CH_3F$, $CH_2F_2$, $CHF_3$, $C_2F_6$, $C_4F_6$, or $C_4F_8$. The fluorine-containing process gas 56 further assists in removal of the residue 34 shown in FIG. 3. It should however be understood that the invention may be carried out without the fluorine-containing process gas 56, i.e. with only the reducing process gas 50 and the oxidizing process gas 52 and still remove the residue 34. An advantage of having the residue 34 removed is that a metal component can be formed in the opening 32 without an intervening wet clean which could damage the dielectric layer 14 or other components on or in the substrate 10.

Further residue removal is achievable by operating at lower temperatures, preferably 10–100° C., and more preferably 30–80° C., and through capacitive coupling to the substrate stand. Lower temperatures avoid hardening of the residue and the additional capacitive coupling activates photoresist removal at lower temperatures.

The following table illustrates experimental results carried out according to the invention.

|  |  | Process |  | Δ Thickness | Strip |  | k stability |  |
|---|---|---|---|---|---|---|---|---|
| Film | Recipe | t sec | ΔT (A) | ER (A/min) | PS SR (A/min) | SR:ER Sel. | Pre k | Δk |
| 1 | A | 60 | 57 | 57 | 10647 | 185 | 2.17 | 0.05 |
| 1 | A | 120 | 56 | 28 |  |  | 2.16 | 0.05 |
| 1 | A | 180 | 46 | 15 |  |  | 2.16 | 0.05 |
| 2 | B | 60 | 76 | 76 | 7673 | 101 | 2.70 | 0.02 |
| 2 | B | 120 | 98 |  |  |  | 2.70 | 0.05 |
| 3 | C | 60 | 29 | 29 | 7673 | 236 | 2.70 | 0.03 |
| 3 | C | 120 | 52 |  |  |  | 2.70 | 0.07 |

Three mixtures A, B, and C were used as indicated below the heading "Recipe". The mixture A consisted of hydrogen gas flowing at a rate of 3000 cubic centimeters per minute, water vapor flowing at a rate varying between 30 and 150 cubic centimeters per minute, a pressure of 2 Torr and a substrate temperature of 250° C. The columns show the time of exposure in seconds, the change in thickness of the dielectric layer in Angstroms, the etch rate of the dielectric layer in Angstroms per minute, the removal rate of the photoresist layer, the selectivity in removal of the photoresist layer over the dielectric layer, the resulting k-value of the dielectric layer, and the-change in k-value of the dielectric layer.

The following table illustrates variations in the A-mixture and recipe.

| Process |  | ΔThickness |  | Selectivity |  | k stability |  |
|---|---|---|---|---|---|---|---|
| Recipe Variation | t (sec) | ΔT (A) | ER (A/min) | PR SR (A/min) | SR:ER Sel. | Pre k | Δk |
| A (see Table 1) | 60 | 58 | 57 | 10647 | 185 | 2.17 | 0.05 |
| 1% H$_2$O | 69 | 27 | 23 9274 | 399 | 2.17 | 0.02 |  |
| 3% H$_2$O | 47 | 79 | 101 | 13804 | 137 | 2.21 | 0.16 |
| 5% H$_2$O | 37 | 80 | 130 | 17499 | 135 | 2.18 | 0.23 |
| 2% N$_2$ | 44 | 470 | 641 | 14668 | 23 | 2.14 | 0.84 |

It can be seen that selectivity to the dielectric is optimal with 1% water vapor. Selectivity decreases when water is increased above 1%, and the k-value of the dielectric layer also increases more dramatically with a water vapor concentration of more than 1%.

Metalization

Figure 6:
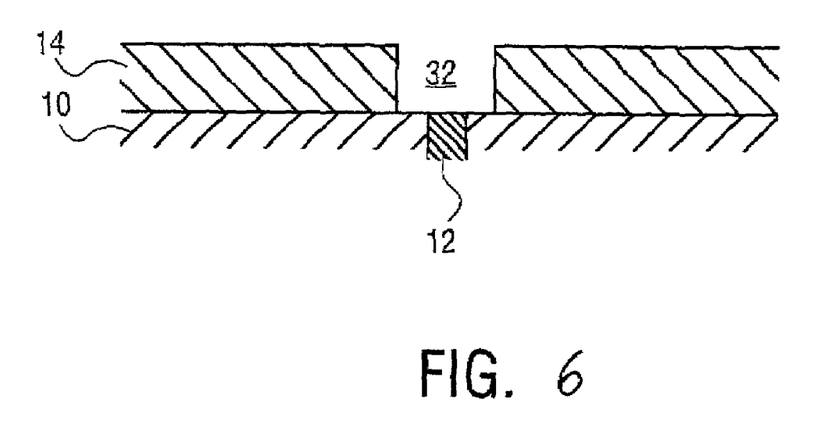
FIG. 6 is a view similar to FIG. 3 after the remaining photoresist layer is removed.

FIG. 6 illustrates a substrate 10 with the dielectric layer 14 thereon directly after etching of the photoresist layer and removal of the substrate 10 through the slit 82. It can be seen that the residue 34 is removed and no residue remains on sidewalls of the opening 32. There is thus no need for a subsequent wet clean to remove residue. This process also reduces or in some cases eliminates additional pre-cleans prior to subsequent deposition steps.

Figure 7:
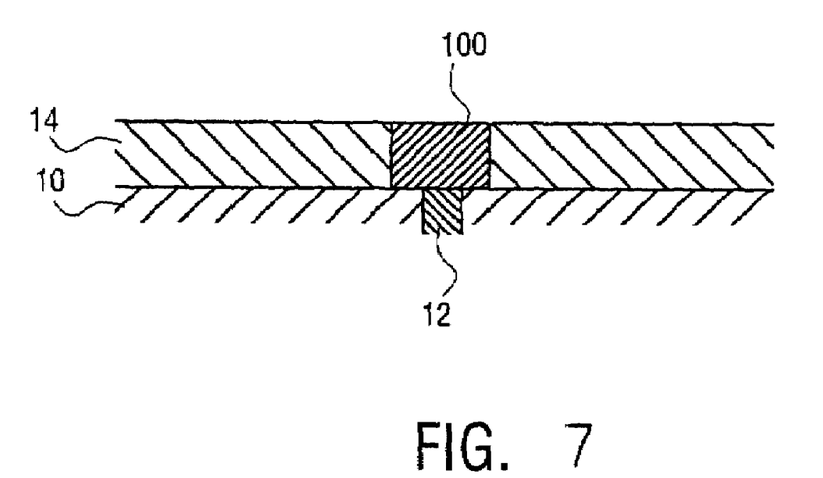
FIG. 7 is a view similar to FIG. 6 after a metal component is deposited over the dielectric layer.

After additional de-gas and pre-cleans such as argon sputtering, a metal barrier layer, such as Ta, TaN, or Ti for a Copper-based metalization scheme, is deposited over the entire topography of the film stack. Then copper is sputtered onto the barrier layer. Subsequently, copper is grown by electrochemical plating and planarized in a chemical-mechanical polishing operation to leave a metal component 100 in the opening as shown in FIG. 7. The metal component 100 is typically made of copper. The metal component 100 contacts the conductive element 12. More metal components may be located within the dielectric layer 14 near the metal component 100. Because of the relatively low k-value of the dielectric layer 14, a signal in the metal component 100 will not significantly influence a current or a signal in another metal component located near the metal component 100 in the dielectric layer 14.

Further Embodiments

In the descriptions of the embodiments that follow, for purposes of efficacy, not all details thereof are described and discussed in detail. Instead, the description of each of the embodiments that follow primarily indicates differences between the specific embodiment described and an embodiment or embodiments that have been described previously. Unless specifically stated otherwise or unless it can be inferred, therefore, it can be assumed that the details of subsequent embodiments are the same as details of embodiments that have been described previously.

Figure 8:
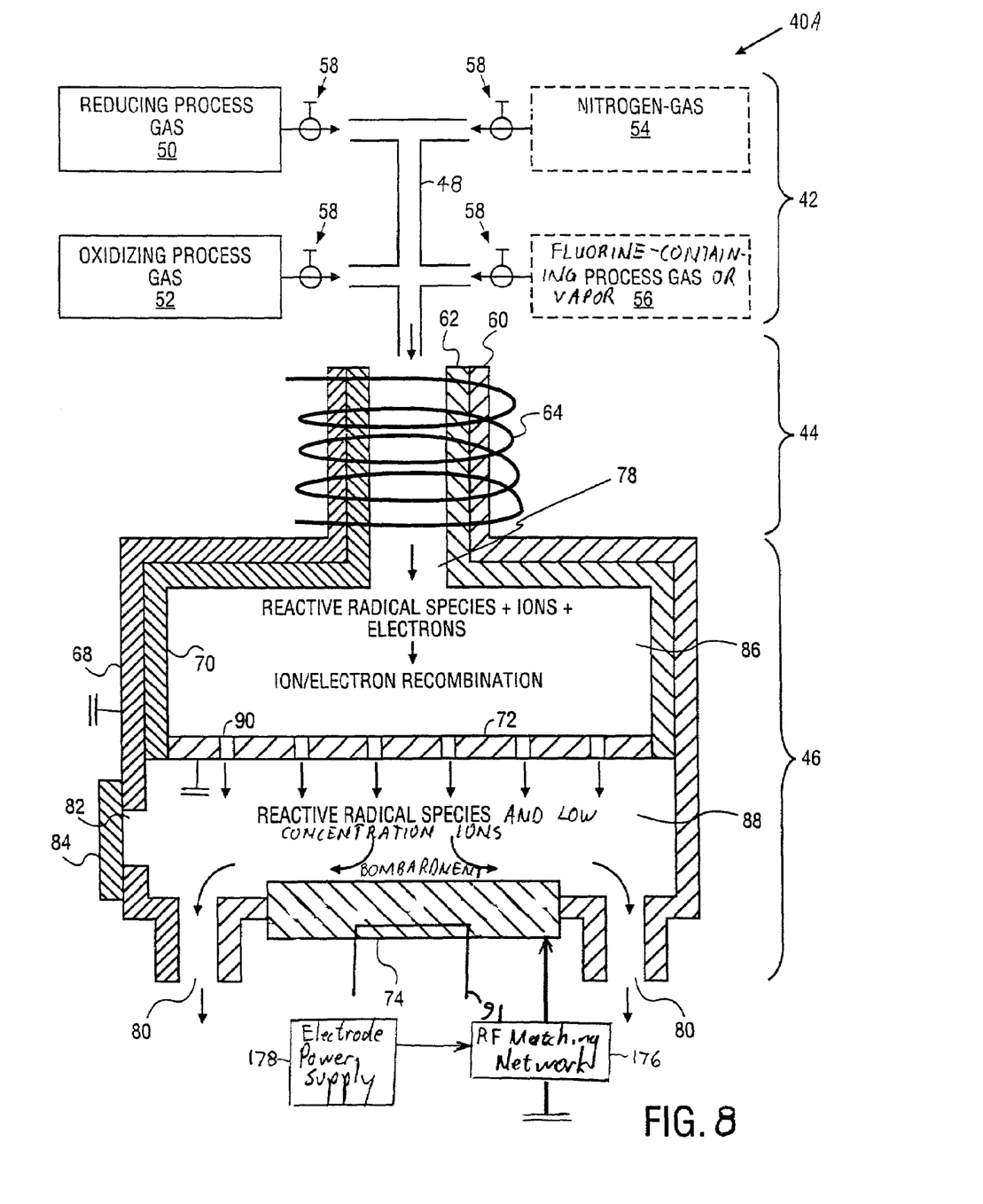
FIG. 8 is a view similar to FIG. 4 illustrating an alternative embodiment of a stripping apparatus.

FIG. 8 illustrates a stripping apparatus 40A according to one alternative embodiment. No heater is provided within the stand 74 but a heat exchanger 91 controls the temperature. Instead, a radio-frequency (RF) matching network 176 is connected to the stand 74. An electrode power supply 178 is connected to the RF matching network 176 to provide power thereto. Both the chamber 68 and the baffle 72 are grounded. The biasing arrangement 176, 178 generates a low concentration of ions in the exposure cavity 88. The concentration of the ions created by the biasing arrangement 176, 178 is sufficiently high so as to, together with the reactive radical species, strip the photoresist layer. The concentration of the ions is however sufficiently low so as not to cause substantial damage to the low-k dielectric material.

Figure 9:
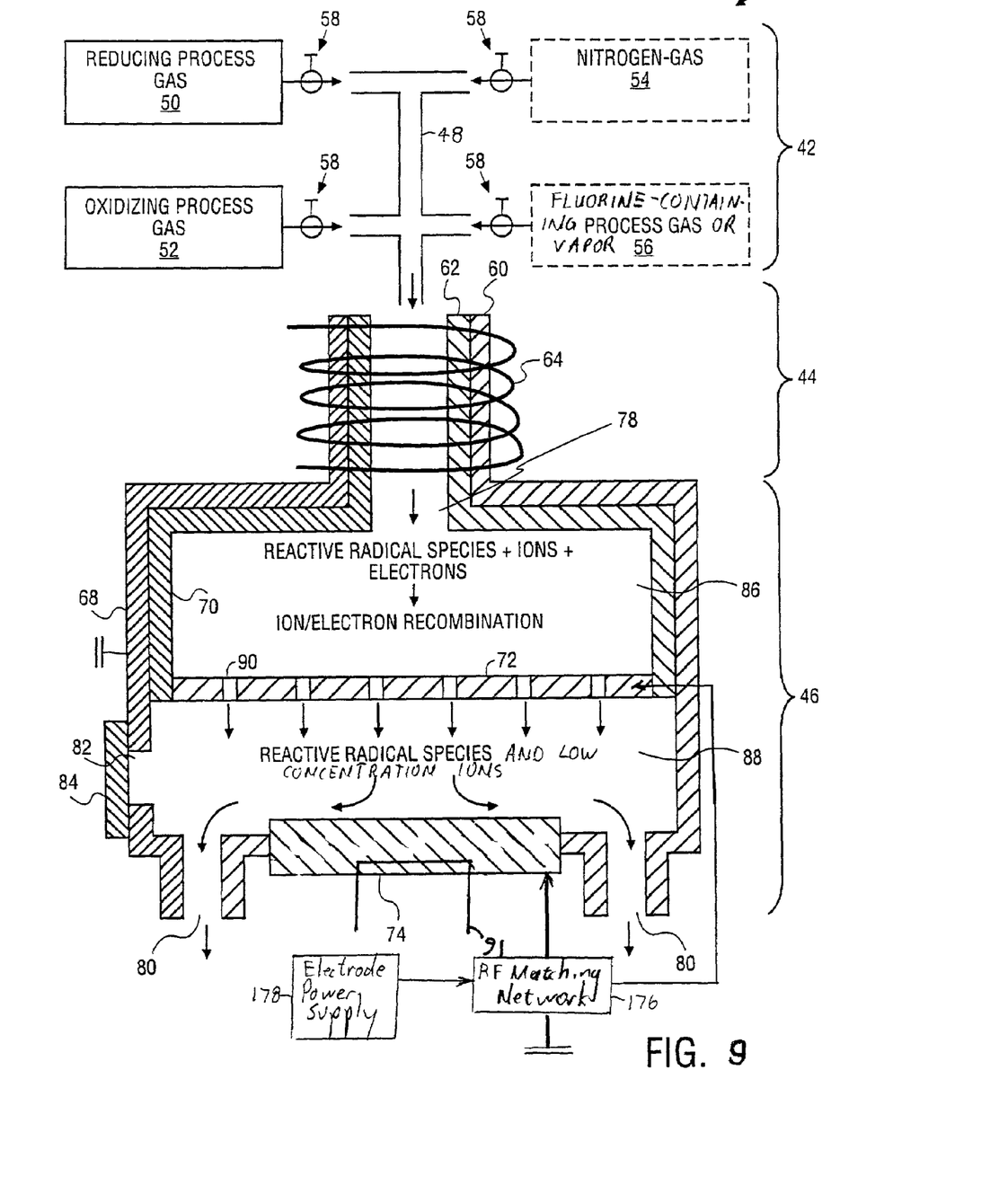
FIG. 9 is a view similar to FIG. 4 illustrating a further embodiment of a stripping apparatus.

In the embodiment of FIG. 8, a bias is created between the stand 74 and the baffle 72. Because of the bias, the ions are accelerated towards the substrate located on the stand 74, and thus bombard of the substrate. To reduce bombardment of the substrate, the apparatus 40A may be modified to the apparatus 40B shown in FIG. 9. In the apparatus 40B, the RF matching network 176 is also connected to the baffle 72. A bias between the baffle 72 and the stand 74 can so be reduced, even to zero. By reducing the bias between the baffle 72 and the stand 74, the ions are not accelerated as much as with the apparatus 40A of FIG. 8, thus causing less bombardment of the substrate.

Although photoresist stripping has been described, it should be noted that the processes discussed herein may also be used for other purposes such as residue removal from sidewalls of trenches, openings or vias in dielectric layers, hardmasks and so forth.

While certain exemplary embodiments have been described and shown in the accompanying drawings, it is to be understood that such embodiments are merely illustrative and not restrictive of the current invention, and that this invention is not restricted to the specific constructions and arrangements shown and described since modifications may occur to those ordinarily skilled in the art.

What is claimed:

1. A method of photoresist removal comprising:
locating a substrate in a processing chamber;
exciting a mixture of gases comprising a majority component of a reducing process gas and a minority component of between 0.1% and 10% by volume of an oxygen-containing process gas to generate a reactive gas mixture including reactive radical species, ions, and electrons;
flowing the reactive gas mixture into a settling cavity, the ions combining with the electrons while the reactive gas mixture is within the settling cavity; and
exposing a photoresist layer overlaying a dielectric layer on the substrate in the chamber to the reactive gas mixture to selectively remove the photoresist layer from the dielectric layer, wherein the settling cavity is located above the substrate, the reactive gas mixture flows through openings in the settling cavity onto the substrate, and the reactive gas mixture contains substantially no ions when the substrate is exposed to the reactive gas mixture.

2. The method of claim 1 wherein the reducing process gas includes at least one of hydrogen, ammonia, an alkane, and an alkene.

3. The method of claim 1 wherein the mixture flows through the chamber while the photoresist layer is removed.

4. The method of claim 3 wherein the component of the reducing process gas flows through the chamber at between 1 standard liter per minute and 10 standard liters per minute.

5. The method of claim 1 wherein the oxygen-containing process gas includes at least one of vaporized water, oxygen gas, carbon monoxide gas, carbon dioxide gas, and an alcohol vapor.

6. The method of claim 1 wherein the oxidizing process gas includes vaporized water.

7. The method of claim 1 wherein the oxidizing process gas substantially increases the rate of photoresist removal when compared with the reducing process gas alone.

8. The method of claim 1 further comprising:
heating the substrate prior to exposure to the reactive gas mixture, the substrate being at a temperature between 150° C. and 400° C. during exposure to the reactive gas mixture.

9. The method of claim 1 further comprising forming a metal part adjacent to the dielectric layer without a wet clean following the removal of the photoresist.

10. The method of claim 9 wherein surfaces of the containing walls exposed to the reactive radical species are made of quartz.

11. The method of claim 9 wherein walls of the chamber form at least part of the containing walls.

12. The method of claim 11 wherein the reactive gas mixtures flows through a plurality of openings in a baffle in the chamber, surfaces of the baffle exposed to the reactive gas mixture being made of quartz.

13. The method of claim 9 further comprising:
preheating the containing walls to a temperature above 400° C. before the reactive radical species flow from the location where they are generated to the substrate.

14. The method of claim 9, further comprising:
using an oxygen-rich gas to dry clean the chamber of organic and inorganic residues between wafer processing in addition to preheating.

15. The method of claim 1 wherein the reactive gas mixture removes residue from an opening in the dielectric layer.

16. The method of claim 15 wherein the metal part is formed in the opening.

17. The method of claim 1 wherein the mixture is energized by an inductively-coupled radio-frequency source.

18. The method of claim 1 wherein the mixture is energized by at least one of a microwave source and a capacitively-coupled source.

19. The method of claim 1 further comprising:
applying a radio-frequency voltage bias to a stand on which the substrate is located.

20. The method of claim 19 further comprising:
applying a radio-frequency voltage bias to a baffle through which the gas flows.

21. The method of claim 1 wherein the dielectric is minimally altered after photoresist and residue removal treatment.

22. The method of claim 1 wherein the mixture includes a minority component of nitrogen gas.

23. The method of claim 1 wherein the mixture includes a minority component of a fluorine-containing process gas.

24. A method of substrate processing, comprising:
forming a dielectric layer with a dielectric constant below 3 on a substrate;
forming a photoresist layer on the dielectric layer;
patterning the photoresist layer by forming openings therein;
exposing the photoresist layer and the dielectric layer to an etchant that etches the photoresist pattern into the dielectric layer;
locating the substrate in a processing chamber;
energizing a mixture of gases comprising a majority component of a reducing process gas, a first minority component of between 0.1% and 10% by volume of an oxidizing process gas, and a second minority component of a fluorine-containing process gas to generate a reactive gas mixture, the reactive gas mixture being primarily generated remotely on the substrate and including reactive radical species, ions, and electrons;
flowing the reactive gas mixture into a settling cavity, the ions combining with the electrons while the reactive gas mixture is within the settling cavity; and
exposing a photoresist layer overlaying a dielectric layer on the substrate in the chamber to the reactive gas mixture to selectively remove the photoresist and organic ARC layer from the dielectric layer, the reactive gas mixture flowing through a plurality of openings in a baffle in the chamber, surfaces of the baffle exposed to the reactive gas mixture being made of quartz, wherein the settling cavity is located above the substrate, the reactive gas mixture flows through openings in the settling cavity onto the substrate, and the reactive gas mixture contains substantially no ions when the substrate is exposed to the reactive gas mixture.

25. The method of claim 24, wherein the fluorine-containing process gas is between 0.1% and 10% of the mixture.

26. The method of claim 25, wherein the fluorine-containing process gas includes at least one of $CF_4$, $NF_3$, $CH_3F$, $CH_2F_2$, $CHF_3$, $C_2F_6$, $C_4F_6$, and $C_4F_8$.

* * * * *